United States Patent [19]

Levy

[11] 4,368,432

[45] Jan. 11, 1983

[54] SINE WAVE GENERATOR FOR DIFFERENT FREQUENCIES

[75] Inventor: Allan Levy, Delray Beach, Fla.

[73] Assignee: Siemens Corporation, Iselin, N.J.

[21] Appl. No.: 206,256

[22] Filed: Nov. 12, 1980

[51] Int. Cl.³ .................... H03B 19/00; H03K 3/80; H03K 13/02

[52] U.S. Cl. .................... 328/14; 340/347 M; 364/721

[58] Field of Search .................... 328/14; 340/347 M; 364/721

[56] References Cited

U.S. PATENT DOCUMENTS

| | | | |
|---|---|---|---|
| 3,569,684 | 3/1971 | Burnett | 235/152 |
| 3,657,657 | 4/1972 | Jefferson | 328/14 |
| 3,728,719 | 3/1972 | Fish | 340/347 |
| 3,849,774 | 11/1974 | Barth | 340/347 DA |
| 3,974,498 | 12/1974 | Kneir | 340/347 |
| 3,992,680 | 11/1976 | Herzl | 328/14 X |
| 4,056,692 | 11/1977 | Place | 328/14 X |
| 4,295,098 | 10/1981 | Crowley | 328/14 X |

OTHER PUBLICATIONS

"Advanced Electronic Circuits", Tietze & Schenk, 1978-Springer Verlag, pp. 411–412; 424–426.

*Primary Examiner*—John S. Heyman

[57] ABSTRACT

A frequency oscillator for generating a square wave output pulse train is connected via a frequency divider circuit to a binary shift register which is designed as a divide-by-n counter with m counter stages, wherein m=n/2. Each stage is associated with an output. A resistor network is composed of m rated resistors each of which resistors is connected to a respective register output and in common to an input of a low-pass filter network forming the output circuit. The rating of the resistors is such that an k—th resistor associated with the k—th output of the shift register has the value $$R_k = \frac{R}{\sine \frac{\pi}{m}(k - C)},$$

wherein
R is a reference resistance value;
k is a positive integer from 1 through m;
C is ½ if m is an odd number; and
C is 0 if m is an even number.

Sine wave forms of different frequencies may be selectively chosen if the frequency divider circuit is provided with parallel inputs which are associated with different dividing ratios and are selectively coupled to the input of the binary shift register.

10 Claims, 4 Drawing Figures

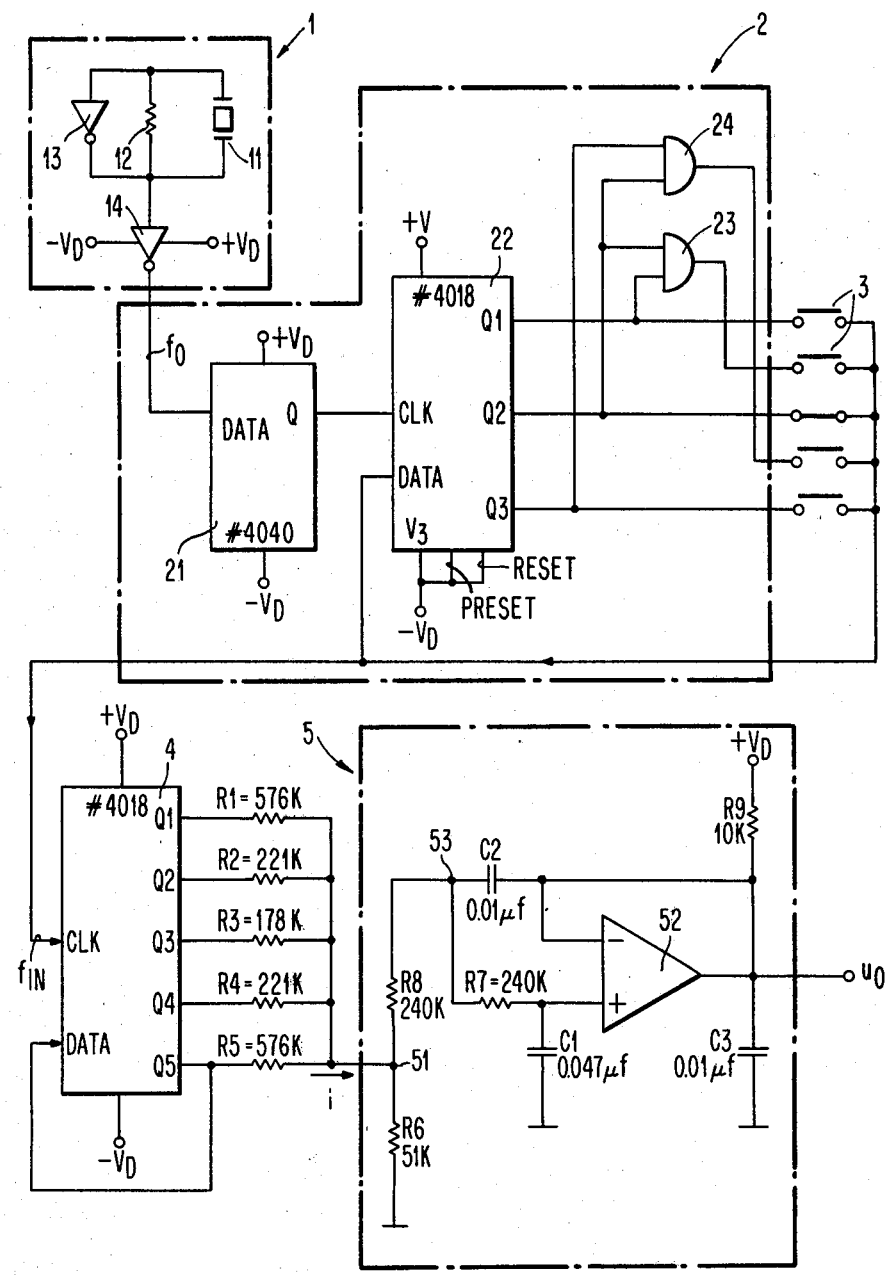

SINE WAVE GENERATOR FOR DIFFERENT FREQUENCIES

BACKGROUND OF THE INVENTION

The invention is related to a sine wave generator composed of digital circuits.

More specifically, the invention is related to a sine wave generator designed for generating sine waves of different frequencies one of which frequencies can be selectively chosen at a specific time.

Besides completely analog sine wave generators of conventional design, there are known digital circuit arrangements for generating a simulated sine or cosine wave form which arrangements are often used in connection with measurement devices. These circuit arrangements are based upon algorithms providing a mathematical approximation of sine waves as, for example, in the form of $$\sin \frac{\pi}{2} x = C_1 x + C_3 x^3 + C_5 x^5 + \ldots$$

where $C_1$, $C_3$, $C_5$ are constants. Such an algorithm can be implemented in a computer system which calculates sine values for generating a sine or cosine wave form.

A somewhat different approach, not to calculate but to store respective sine or cosine values is known from a sine-cosine-generator described in U.S. Pat. No. 3,569,684 to Burnett. The known generator is composed of a diode array forming a fixed memory for storing binary values of the sines of angles and of means for addressing memory locations which means are integral with the memory. Such a circuit arrangement can be very useful for applications, in which analog values of angles measured in radians are picked off, for example, from a gyro or other inertial instruments and converted into a binary number representing the angle. This number is used as an input to the address means of the system for selecting the location in the fixed memory wherein the sine of the angle is stored. Information is read out and compared with the value of the sine of the angle which should have been read from the memory of a computer. If the actual value is different from the required value, an error signal is generated to correct the position of the instrument from which the angle was picked off.

Another digital-to-analog converter for converting digital angular data to analog angular data for controlling servo mechanisms and the like has been described in U.S. Pat. No. 3,728,719 to Fish disclosing an R-2R-resistive ladder network of a digital-to-analog converter. This converter has inputs for digital angular data which are applied to integrated switches to cause predetermined switching-on of resistors of the ladder network, thus providing sine and cosine approximation of analog voltage functions representing the digital input signals. Some of the digital signals control quadrant switches to produce quadrant reference phase relationships and the remainder of such control analog signals provide amplitude scaling to drive a synchromechanism in angular correspondence with the digital angular data input circuit. The ladder network consisting of R-2R-stages together with correspondingly controlled switches supplies a sine or cosine function. The practical instrumentation simulates an approximation of a sine wave form. This approximation becomes more and more accurate with a higher number of resistor stages.

In principle, the known circuit arrangement is based upon the assumption that any analog value can be composed of digital values which are represented by respective resistor stages and the associated switch in the known circuit arrangement. A systematic error, therefore, is due to the finite combination of ladder stages.

A similar circuit arrangement is known from U.S. Pat. No. 3,974,498 to Knier disclosing a switching arrangement for the transformation of digital angles into analog sine- and/or cosine values. A resistance network is provided consisting of a series of individual resistors whose resistance values are selected according to a certain function. A digital control register buffers the input angle in digital form and has a respective series of resistor stages for representing digital values which are graded so that the control register is capable of representing angles at least in a range of 0° to 45° according to the same function as the resistance values and with a respective one of the register stages thus being assigned to each of the individual resistors. There is also provided a constant voltage source such that a reference voltage supplied by such source will be essentially independent of the angle value registered in the digital control register. The converter circuitry further includes a selectively switched correcting circuit, preferably in the form of a second resistance network and a series of switches controlled in accordance with the input angle to create an angle-dependent compensating function whose analog variation as a function of the input angle modifies the overall analog output of the converter circuitry so as to approximate the exact course of the trigonometric function or functions to a desired precision.

Basically, all those known digital-to-analog converters generate an analog output signal corresponding to a digital input signal, both signals representing a specific value such as an angle value which value is supplied to the digital-to-analog converter in digital form to control the operation of the converter. All these circuit arrangements are of relatively complex design. This design reflects the preferred applications of the circuit arrangements described above as parts of measurement devices where high precision is required.

In a variety of applications for sine wave generators, however, the precise angular approximation of the sine wave is less important than is a highly stabilized frequency. Representing sine wave generators of this type, a digital-to-analog converter designed as function generator is known from "Advanced Electronic Circuits" of Tietze and Schenk, edited by Springer-Verlag New York, 1978, Chapter 14 "D/A and A/D Converters," pages 411 through 441. Especially with reference to FIGS. 14.18 through 14.21 there is described an implementation of a digital-to-analog converter which is used as sine wave function generator. The generator employs two resistor networks. Each of which networks is composed of a variety of rated resistors which are commonly connected to either a positive or a negative supply voltage, respectively. Each resistor of both networks is selectively connectable to a common output line via a respective switch. The signals carried on the output line are supplied to an inverting input of an operational amplifier designed as comparator having a positive input which is coupled to ground.

The rating of the resistors is such a piece-wise approximation of a sine wave is achieved if the switches are selectively operated in a given sequence with equidistant time intervals. The switches can be implemented by an analog multiplexer circuit which is controlled by a cyclic straight binary counter. This counter, in turn, receives a pulse train of predetermined frequency. Any change of the frequency of this pulse train results in analog output signal train of different frequency since input frequency and output frequency are directly related to each other.

Another characteristic of this known circuit arrangement is that just one of the resistors of both networks is connected to the common output at a time and that a current determined by this operable resistor and the associated direct current voltage source defines the present step value of the resulting sine wave. Compared with the previously described devices, the outlay of this known device is rather small and the achieved performance accordingly also relatively unprecise. The main restriction of the known device is based upon the scheme of the selective switching arrangement.

It is, therefore, an object of the present invention to provide an improved sine wave generator which is composed of digital circuits.

Another object of the present invention is to provide such a sine wave generator which includes a highly efficient network for simulating a sine wave shape while still being easily adjustable for generating sine waves of different frequencies.

SUMMARY OF THE INVENTION

These objects, as well as other objects which will become apparent in the discussion that follows, are achieved according to the present invention by providing a high frequency oscillator for generating a square wave output pulse train. The pulse train is supplied to a frequency divider circuit which is composed of binary counters. A binary shift register which is designed as divide-by-n counter and which has m counter stages, wherein m=n/2, is connected by a clock input to an output of the frequency divider circuit. The shift register has m outputs each associated with a respective counter stage. There is also provided a resistor network composed of m rated resistors having first and second taps. The resistors are arranged in parallel with respect to their first taps. Each of the second taps is connected to a respective one of the outputs of the shift register. The rating of the resistors is such that a k-th resistor associated with the k-th output of the shift register has the value $$R_k = \frac{R}{\sin \frac{\pi}{m} (k - C)}$$

wherein
R is a reference resistance value;
k is a positive integer from 1 through m;
$C = \frac{1}{2}$ if m is an odd number; and
C = 0 if m is an even number.
A low-pass filter network is coupled by an input to the commonly connected first taps of the resistors. An output of the filter network forms the output for the sine wave signal of the generator.

According to a special feature of the present invention, the shift register is composed of Johnson-counter stages and is connected to identical positive and negative supply voltages whereby the shift register is operated in a manner which is balanced with respect to a reference level of 0 V. This design characteristic allows to employ the same resistors of the resistor network for simulating the positive part and the negative part of the sine wave shape without any offset by a direct current component or other distortions which might arise if separate resistor networks are used for positive and negative parts of the sine wave shape.

This circuit design is especially advantageous for use with sine wave generators which are easily adjustable to generate sine waves of different frequencies. In this case, according to a further specific feature of the present invention, the frequency divider circuit comprises a ripple carry binary counter which has a data input connected to the output of the square wave oscillator and which is symmetrically arranged between positive and negative supply voltages. Furthermore, there is provided a second shift register which is composed of Johnson-counter stages and which is symmetrically arranged between positive and negative supply voltages, as well. A clock input of this register is connected to the output of the ripple carry binary counter. One of the parallel outputs which are associated with the counter stages is selectively connected to the data input of the shift register, thus determining the dividing rate of the register according to the order of the counter stage being connected to the data input. Conventional shift registers consisting of five Johnson-counter stages, for example, may thus be used for performing a divide-by-n operation wherein n is an even number between 2 and 10.

Additionally, also dividing rates based upon the intermediate odd numbers can be accomplished by a logic network composed of AND-gates having two inputs arranged at the output side of the second shift register. Both inputs of each of the AND-gates are connected to respective ones of two neighboring outputs of the shift register. Each of the outputs of the AND-gates thus forms an additional divider output.

BRIEF DESCRIPTION OF THE DRAWINGS

A better understanding of the invention may be had by reference to the following description of preferred embodiments in conjunction with the accompanying drawings, in which:

FIG. 4 is a detailed block diagram representing an implementation of a sine wave generator as shown in FIG. 1.

DESCRIPTION OF THE PREFERRED EMBODIMENTS

The preferred embodiments of the present invention will now be described with reference to FIGS. 1 through 4.

Figure 1:
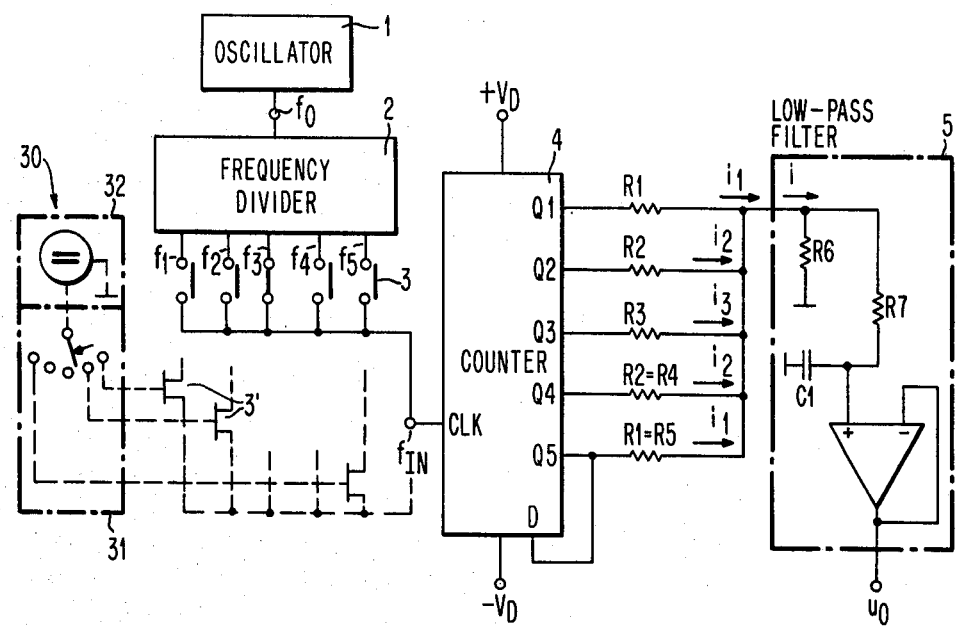
FIG. 1 is a basic block diagram of a sine wave generator for different frequencies. According to the present invention, the sine wave generator is composed of a binary counter implemented by Johnson-counter stages and of a resistor network arranged at the outputs of the counter.

FIG. 1 represents the basic block diagram of a sine wave generator which also could be referred to as digital-to-analog converter which is mainly composed of digital circuits. There is provided an oscillator 1 for generating a high frequency square wave pulse train $f_o$ at an output. The oscillator may be of any conventional design but should be stabilized in frequency since its frequency is the reference for the frequency of a sine wave to be generated.

The output of oscillator 1 is connected to a clock input of a frequency divider circuit 2 which also may be of any conventional design for dividing the input reference frequency $f_o$ by a predetermined rate which depends upon the ratio of the reference frequency and the frequency of the sine wave to be generated. As will be described later in detail, the frequency divider circuit 2 comprises a variety of parallel outputs for supplying pulse trains of different intermediate frequencies f1 through f5.

These outputs are selectively to be coupled to a common output line as indicated by jumpers 3. Such implementation may be chosen when the sine wave generator basically designed for generating sine waves of different frequencies is more or less permanently utilized for generating a sine wave pulse of fixed frequency. Nevertheless, the sine wave generator may be readjusted to generate a sine wave of a different frequency just by connecting another output to the common output line.

A more temporary selection of one of the sine wave frequencies may be had if according to a second implementation shown in dotted lines below each output of the frequency divider circuit is connected to the common output line by a respective one of transistor switches 3'. As indicated in FIG. 1 transistor switches 3' may simply be controlled by a selector unit 30 comprising a control voltage source 32 which is selectively to be applied to control electrodes of transistor switches by means of a gang switch 31.

The selected and through-connected output of the frequency divider circuit 2 is coupled to a clock pulse input CLK of a shift register 4. The shift register may be implemented as a binary counter, for example, composed of five counter stages with respective outputs Q1 through Q5. In such implementation a ring shift is performed by connecting one of these outputs to a data input D.

Let it be assumed as indicated in FIG. 1 that shift register 4 is composed of five Johnson-counter stages and output Q5 of the fifth counter stage is fed back to data input D. In this case shift register 4 in addition to frequency divider circuit 2 also operates as further frequency divider which divides the input frequency supplied to its clock input CLK by 10. In general, the shift register 4 may be composed of any plurality m of counter stages and have a dividing rate n, whereby n=2m if all stages are used.

At the output side of shift register 4 there is arranged a resistor network composed of rated resistors R1 through R5. Each of these resistors is connected by a first tap to a respective one of outputs Q1 through Q5 of shift register 4. The opposite taps of resistors R1 through R5 are commonly connected to one connecting point forming the output of the resistor network. The resistors are implemented with a relatively high resistance value and are rated such that resistor $R_k$ associated with the corresponding k-th counter stage of the shift register 4 has the value $$R_k = \frac{R}{\sine \frac{\pi}{m}(k-C)}$$

wherein
R is a reference resistance value;
k is a positive integer from 1 to m;
C is ½ if m is an odd number; and
C is 0 if m is an even number.

This characteristic of the rating of resistors R1 through R5 will become more apparent from the detailed description of FIG. 2 and FIG. 3 later on. Presently it seems to be sufficient to know that shift register 4 being arranged between positive and negative supply voltages $+V_D$ and $-V_D$, respectively, serves as common voltage source for all parallel branches of the resistor network. Depending on the value of respective resistors, partial direct currents $i_l$ through $i_k$ flow through each branch. These partial currents are summed up to a sum current i at the common connecting point. Let it be noted that the direction of the flow of the partial current in each case depends upon the state of the respective counter stage of shift register 4.

This sum current i is supplied to an input of a low-pass filter network 5. A further resistor R6 is arranged between this input and ground. Depending upon the present value of sum current i a voltage drop occurs across this resistor which voltage is supplied to a filter circuit. An implementation of the low-pass filter network will be described later in detail. Let it be noted that the low-pass filter generates an output signal $u_o$ at an output which signal is the analog equivalent of the sum current i and the input voltage of the filter network, respectively.

How this analog output signal $u_o$ is derived will now be described in detail in conjunction with graphs shown in FIGS. 2 and 3. FIG. 2 shows different wave forms representing in a proper timely relationship bipolar output signals at outputs Q1 through Q5 of shift register 4. According to the ring shift characteristic of shift register 4 information is shifted from counter stage to counter stage and, accordingly, an output signal transition from positive to negative state, or vice versa, is occurring at the output of the neighboring counter stage after a time delay of Δt which corresponds to the reciprocal of the pulse rate of the digital input signal supplied to clock input CLK of shift register 4. Correspondingly, the partial currents $i_k$ flowing through the branches of the resistor network have either positive or negative signs.

Figure 2:
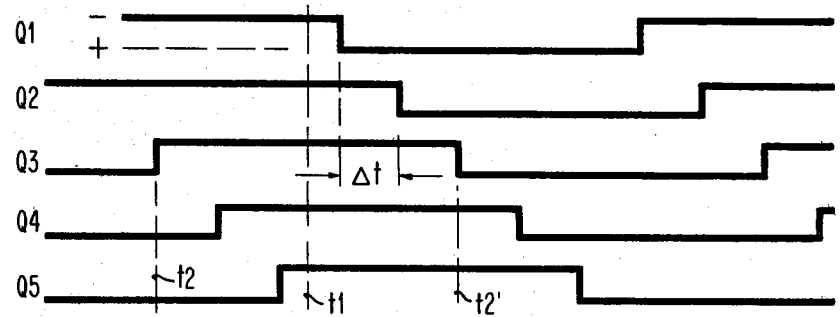
FIG. 2 is a graph showing the time relationships of the output signals of the Johnson-counter stages of the binary counter of FIG. 1.
Figure 3:
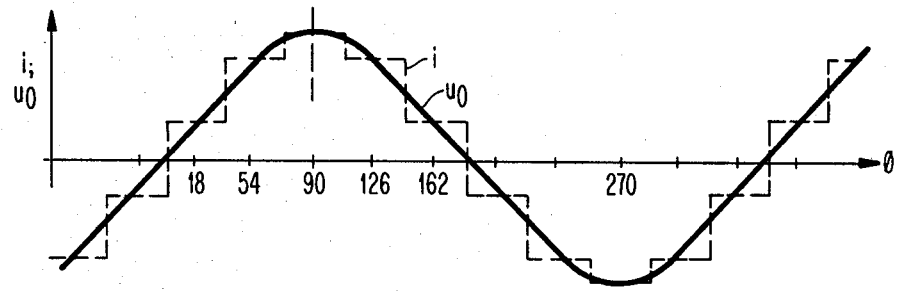
FIG. 3 is another graph representing in broken lines a step-function obtained from the output signal of the counter in conjunction with the operation of the resistor network and showing in a full line a sine wave shape derived from that step function by low-pass filtering.

The resulting sum current i is represented in a step function wave form which is shown in a broken line in FIG. 3 with reference to an angular φ-scale. This step function can be graphically and immediately derived from corresponding conditions of the counter stages shown in FIG. 2 above, with the understanding that the amplitude difference between two neighboring steps is also dependent upon the rating of resistors R1 through R5 of the resistor network. As to be seen from FIG. 2, at a time t1, all counter stages of shift register 4 are in a positive state. This time corresponds to the π/2−value (90° value) of the sine wave shape $u_o$ and the step wave form i, respectively.

At times t2 and t2' the center counter stage just switches from one state into the other. At those times, two of the counter stages are in a positive state and the remaining two counter stages are in a negative state.

Subject to the rating of the corresponding resistors, R1, R2 and R4, R5, respectively, the partial currents $i_1$ through $i_k$ result in a sum current i which is of zero value. The corresponding values of the $\phi$—scale are $\phi=0$ and $\phi=\pi$, respectively. The reciprocal conditions of the counter stages as shown at the left-hand margin of the graph of FIG. 2 correspondingly result in establishing the negative branch of the step wave form and the sine wave form, respectively.

In the implementation shown in FIG. 1, shift register 4 assumes again the same state of operation after a cycle of ten clock pulses with the understanding that $M=(n/2)=5$. This means that a full period of the step wave and the corresponding sine wave are composed of ten step values with a step width of $\pi/5=36°$. Since the step wave form and also the sine wave form have to be centered to be symmetrical with respect to $\phi=\pi/2$ and $\phi=3\pi/2$, the sampling angles of the sine wave form are 18°, 54°, 90°, 126°, 162°, 198°, etc. Correspondingly, the first resistor R1 of the resistor network in accordance with the equation given as above is determined by the value R/sine 18°, for example.

In other implementations of shift register 4 and its associated resistor network with an even number of counter stages and respective resistors, constant C of the above described equation for rating resistors $R_k$ has the value zero since all sampling points are automatically centered with respect to maximum, minimum and zero values of the sine wave form.

A more detailed implementation of a sine wave generator is represented by the block diagram of FIG. 4. Oscillator 1 is composed of a quartz crystal 11, a relatively high ohmic further resistor 12 and a conventional inverter 13, which elements are arranged in parallel. In series to this parallel network, there is arranged a second inverter 14 which is inserted between this network and the output of the oscillator 1. This second inverter is symmetrically supplied with supply voltages $+V_D$ and $-V_D$, respectively, thus being designed to generate a bipolar output pulse train with a stabilized reference frequency $f_o$.

This high frequency signal is fed to the frequency divider circuit 2 which is mainly composed of two stages, a conventional binary counter 21 designed as a ripple binary counter and a further divide-by-n counter 22 composed of a plurality of Johnson-counter stages. Both devices are again symmetrically arranged between positive and negative supply voltages $+V_D$ and $-V_D$ and therefore produce bipolar output pulses. The first device divides the incoming signal pulse train $f_o$ which is supplied to its data input with a ratio of $1:2^z$ wherein z represents the number of stages of the binary counter 21. With conventional components and a corresponding external wiring, a great flexibility in achieving a desired dividing rate is available.

An output signal obtained from a selected output stage of binary counter 21 is fed to a clock input CLK of Johnson counter 22. There is chosen a digital component which has five Johnson-counter stages, for example RCA component No. CD 4018. In the implementation just three of these stages are used which is indicated in FIG. 4 by respective outputs Q1, Q2 and Q3.

The design of the chosen component is such that respective external connections of output stages Q1, Q2 or Q3 to the data input of the component determine a divide-by-2 operation, a divide-by-4 operation and a divide-by-6 operation, respectively. A divide-by-3 operation can be achieved if outputs Q1 and Q2 are commonly connected to the data input via an AND-gate 23. Correspondingly external wiring for selecting a divide-by-5 operation includes a second AND-gate 24 which is inserted between outputs Q2 and Q3, on the one hand, and the data input, on the other hand. As indicated in the drawing no preset or reset measure is necessary and the respective inputs of the component are connected to negative supply voltage $-V_D$.

Since the sine wave generator of the present invention shall be adjustable for generating sine wave forms of different frequencies, measures have to be taken for selectively through-connecting one of the described external feedback lines to the data input of binary counter 22. Apparently there are several possibilities for implementing such a measure. A very simple solution is shown in the drawing: Each of the outputs of the counter stages and of both AND-gates are connected to a respective one of first connector taps of jumpers 3 which second connector taps are commonly connected to the data input of counter 22. For selecting one out of five different frequencies just the respective jumper has to be attached to both of its connector taps, as is indicated for jumper 3 in the center, whereas the remaining connections are left open. Whenever another one of the group of selectable frequencies has to be chosen, simply a different through-connection by replacing and changing the position of the jumper is established. This measure of through-connecting selectively one of the outputs of frequency divider circuit 2 to the data input of the second binary counter 22 apparently can be implemented in different ways. Another example of a switch controlled through-connection has been described above in conjunction with FIG. 1. The common feedback line to the data input of binary counter 22 also forming the output of the frequency divider arrangement carries a timing signal pulse train having a frequency $f_{in}$. This pulse train is supplied to the clock input CLK of a further binary counter 4 which may be implemented by the same digital component as proposed for binary counter 22. Again, binary counter 4 is symmetrically supplied with positive and negative supply voltages $+V_D$ and $-V_D$. In this design the component is used as a divide-by-10 counter since output Q5 of the fifth Johnson-counter stage is externally connected with the data input of counter 4.

Associated with outputs Q1 through Q5, there is arranged the resistor network composed of resistors R1 through R5. Each of these resistors is connected to a respective one of the outputs Q1 through Q5 of binary counter 4 by one tap, whereas the opposite taps of these resistors are commonly connected to one output.

The resistor network and its operation have been described in detail in conjunction with FIGS. 1 through 3. In accordance with the rating scheme of resistors R1 through R5 resistance values have been chosen as indicated in FIG. 4. It may be noticed that resistance value R=178K of resistor R3 can be interpreted as the reference resistance value from which value the values of the remaining resistors R1, R5 and R2, R4 are derived. Thus by the cooperation of the second binary counter 4 and the resistor network the step wave form of sum current i is generated at the common connector point of the resistor network which step wave form is represented in FIG. 3.

The harmonic content of this step function has to be filtered out for deriving the flat sine wave form. This is achieved by supplying sum current i to an input 55 of the low-pass filter network 5. Between input 55 and ground there is arranged further resistor R6. The sum current i supplied to input 51 of the filter network while flowing through this resistor causes a voltage drop which is further processed in the low-pass filter network. The non-inverting active filter is composed of two capacitors C1 and C2, two further resistors R7 and R8 and an operational amplifier 52 which is designed as open collector comparator. Resistor R8 is connected by one tap to input 51 and by the opposite tap via a connecting point 53 to block capacitor C2. The opposite tap of block capacitor C2 is commonly connected to the inverting input (−) and the output of operational amplifier 52 whereby feedback from the output of operational amplifier 52 to its inverting input is established. A further resistor R9 designed as load resistor is provided for coupling the output of operational amplifier 52 to positive supply voltage $+V_D$. The non-inverting input (+) of operational amplifier 52 is connected via resistor R7 having the same value as resistor R8 to connector point 53. Finally the filter capacitor C1 is arranged between the non-inverting output of operational amplifier 52 and ground.

Furthermore, at the output of the operational amplifier 53 there is arranged a third capacitor C3 which is connected to ground and which forms a by-pass capacitor for preventing the active filter network from oscillating. Thus, the filter network mainly is designed as a network having a relatively high input impedance to prevent excessive current load from the second binary counter 4 and as active low-pass filter with an operational amplifier serving as comparator in an open collector circuit. The output of the operational amplifier finally is the output of the sine wave generator supplying the output signal $u_o$.

There has thus been shown and described a novel sine wave generator which fulfills all the objects and advantages sought therefor. Many changes, modifications, variations and other uses and applications of the subject invention will, however, become apparent to those skilled in the art after considering the specification and the accompanying drawings, which disclose preferred embodiments thereof. All such changes, modifications, variations and other uses and applications which do not depart from the spirit and scope of the invention are deemed to be covered by the invention which is limited only by the claims which follow.

What is claimed is:

1. A sine wave generator composed of digital circuits comprising:
    (a) a high frequency oscillator for generating a square wave output pulse train;
    (b) a frequency divider circuit being composed of
        a first ripple carry binary counter having a data input and an output, and being symmetrically arranged between positive and negative supply voltage, said data input being connected to said output of said square wave oscillator; and
        a second shift register including Johnson-counter stages being symmetrically arranged between positive and negative supply voltage, having a data input, a clock input connected to said output of said binary counter and having parallel outputs, one of said parallel outputs forming an output of said frequency divider network;
    (c) a binary shift register being designed as a divide-by-n counter and having m counter stages, wherein m=n/2, said shift register having a clock input connected to said output of said frequency divider circuit and having m outputs each associated with a respective one of said counter stages;
    (d) a resistor network being composed of m rated resistors having first and second taps and being arranged in parallel with said first taps connected together, and each of said second taps being connected to a respective one of said outputs of said shift register, wherein the rating of said resistors is such that an k-th resistor associated with the k-th output of said shift register has the value $$R_k = \frac{R}{\operatorname{sine}\frac{\pi}{m}(k - C)}$$

and wherein
k is a positive integer from 1 through m;
R is a reference resistance value;
$C=\frac{1}{2}$ if m is an odd number; and
C=0 if m is an even number; and
    (e) a low-pass filter network having an input and an output, said network input being connected to said commonly connected first taps of said resistors and said network output forming the sine wave signal output of said generator.

2. The sine wave generator as recited in claim 1, wherein said shift register is composed of Johnson-counter stages and is connected to identical positive and negative supply voltages whereby said shift register is operated in a manner which is balanced with respect to a reference level of zero volts.

3. The sine wave generator as recited in claim 2, comprising a further resistor arranged between said commonly connected first taps of said resistor network and ground.

4. The sine wave generator as recited in claim 1, wherein the low-pass filter network further comprises:
    (e1) an operational amplifier having a positive and a negative input and an output, said output being connected to said output of said sine wave generator;
    (e2) a voltage divider composed of two further resistors being connected in series via a connector tap, said voltage divider being arranged between said input of said filter network and said positive input of said operational amplifier;
    (e3) a first capacitor coupled to said positive input of said operational amplifier and connected to ground;
    (e4) a second capacitor inserted between said connector tap and said negative input of said operational amplifier; and
    (e5) a load resistor arranged between positive supply voltage on one hand and said negative input and said output of said operational amplifier on the other hand.

5. The sine wave generator as recited in claim 4, wherein said low-pass filter network further comprises a by-pass capacitor arranged between said output of said operational amplifier and ground.

6. The sine wave generator as recited in claim 1, wherein said high frequency oscillator further comprises:
    (a1) a parallel circuit including a quartz crystal, a further resistor and a first inverter; and
    (a2) a second inverter being arranged between said parallel circuit and said output of said oscillator in a series orientation with respect to said first inverter.

7. The sine wave generator as recited in claim 1, wherein the second shift register further comprises:
  (b3) an output network including a plurality of AND-gates each having two inputs and an output, said inputs of each of said AND-gates being connected to two neighboring outputs of said shift register and each of said outputs of said AND-gates forming an additional divider output; and
  (b4) a feedback line from said output of said frequency divider circuit to said data input of said second shift register.

8. The sine wave generator as recited in claim 1, further comprising means for selectively connecting one of said parallel frequency divider outputs to said clock input of said first shift register.

9. The sine wave generator as recited in claim 8, wherein said connecting means further comprise a set of jumpers, each of said jumpers being associated with a respective one of said outputs of said frequency divider circuit for coupling a respective one of said outputs of said second shift register to said clock input of said first shift register.

10. The sine wave generator as recited in claim 8, wherein said connecting means further comprise a set of transistor switches, each having two main electrodes and a control electrode, each of said switches arranged by said main electrodes between a respective one of said parallel outputs of said second shift register and said input of said first shift register; and a selector circuit including a gang switch having an input and outputs, each of said outputs of said gang switch connected to a respective one of said control electrodes; and a direct current voltage source connected to said input of said gang switch.

* * * * *